United States Patent
Tada et al.

(10) Patent No.: US 8,715,837 B2
(45) Date of Patent: May 6, 2014

(54) BLACK-COATED STEEL SHEET, WORKED MATERIAL, AND PANEL FOR FLAT-PANEL TELEVISION

(75) Inventors: Chiyoko Tada, Chiba (JP); Hiroyuki Ogata, Chiba (JP)

(73) Assignee: JFE Steel Corporation (JP)

( * ) Notice: Subject to any disclaimer, the term of this patent is extended or adjusted under 35 U.S.C. 154(b) by 473 days.

(21) Appl. No.: 13/061,981

(22) PCT Filed: Sep. 8, 2009

(86) PCT No.: PCT/JP2009/065982
§ 371 (c)(1),
(2), (4) Date: May 25, 2011

(87) PCT Pub. No.: WO2010/030022
PCT Pub. Date: Mar. 18, 2010

(65) Prior Publication Data
US 2011/0217565 A1 Sep. 8, 2011

(30) Foreign Application Priority Data
Sep. 9, 2008 (JP) ................................. 2008-231225

(51) Int. Cl.
*B32B 15/04* (2006.01)
*B32B 15/08* (2006.01)
*B32B 15/09* (2006.01)
*B32B 15/18* (2006.01)

(52) U.S. Cl.
USPC ........... 428/626; 428/634; 428/627; 428/659; 428/685; 428/684; 428/336; 428/687

(58) Field of Classification Search
USPC ......... 428/634, 627, 624, 626, 660, 658, 659, 428/684, 685, 336, 687, 457, 458, 461, 468, 428/704
See application file for complete search history.

(56) References Cited

U.S. PATENT DOCUMENTS

2009/0011274 A1* 1/2009 Ogata et al. ................... 428/626

FOREIGN PATENT DOCUMENTS

| JP | 4-215873 A | 8/1992 |
|---|---|---|
| JP | 2005-052997 A | 3/2005 |
| JP | 2005-153337 A | 6/2005 |
| JP | 2007-269010 A | 10/2007 |
| WO | WO 2007/102593 | * 9/2007 |

* cited by examiner

*Primary Examiner* — Michael E La Villa
(74) *Attorney, Agent, or Firm* — DLA Piper LLP (US)

(57) ABSTRACT

A black-coated steel sheet exhibits good bendability and a good appearance after press working is provided. Zinc based plating layers, a chromium-free chemical conversion coating disposed on the zinc based plating layer, and a colored single organic coating which is disposed on the chemical conversion coating and which contains a polyester resin having a hydroxyl value of 10 KOHmg/g or more, an imino-containing melamine resin, and 5 to 15 percent by mass of carbon black are included, wherein the glass transition temperature (Tg) of the organic coating is 40° C. or higher, the film thickness is 10 μm or less, and the hardness is 200 N/mm² or more.

9 Claims, No Drawings

BLACK-COATED STEEL SHEET, WORKED MATERIAL, AND PANEL FOR FLAT-PANEL TELEVISION

RELATED APPLICATIONS

This is a §371 of International Application No. PCT/JP2009/065982, with an inter-national filing date of Sep. 8, 2009 (WO 2010/030022 A1, published Mar. 18, 2010), which is based on Japanese Patent Application No. 2008-231225, filed Sep. 9, 2008, the subject matter of which is incorporated by reference.

TECHNICAL FIELD

This disclosure relates to a black-coated steel sheet, a worked material, and a panel for a flat-panel television. In particular, the disclosure relates to a black-coated steel sheet which is excellent in bendability and appearance after press working, which is thin, and which has a high hardness coating film.

Our black-coated steel sheets are suitable for a raw material of casings of AV apparatus and the like typified by panels for flat-panel televisions, e.g., liquid crystal televisions and plasma televisions.

BACKGROUND

In general, a coated steel sheet is subjected to press working or bending in forming into, for example, a panel for a television and is required to exhibit bendability and good appearance after press working. In general, a precoated steel sheet (coated steel sheet) is formed from a double coated steel sheet, in which usually, a modified polyester resin or an epoxy resin is primarily used as an undercoating film on the external surface side, to ensure the adhesion to the base steel sheet, the corrosion resistance, and the like, and furthermore, a polyester based coating film, an acryl based coating film, or the like is used as an overcoating film on the external surface side, to provide mainly the stain resistance, the design flexibility, the scratching resistance, the ethanol resistance, the barrier performance which is the hydrochloric acid resistance or the alkali resistance, and the like. Moreover, a triple coated steel sheet, in which an intermediate coating film is disposed between the undercoating film and the overcoating film, is also mentioned.

As disclosed in Japanese Unexamined Patent Aplication Publication No. 4-215873, in general, a conventional double coated steel sheet is required to have a film thickness of undercoating film of about 5 μm and a film thickness of overcoating film of at least 12 μm, and the total film thickness of these coating films is specified to be 20 μm or more from the viewpoint of concealment performance and the like. However, to form 20 μm of thick coating film, times for coating and baking increase and a larger thickness of the coating is disadvantageous from the viewpoint of production cost. Consequently, thickness reduction of coating film has been desired from the viewpoint of rationalization of coating operation and savings in resources.

In response thereto, we proposed a coated steel sheet having coating film hardness excellent in bendability and appearance after press working even when the film thickness was 10 μm or less on the basis of addition of resin particles to a coating film in Japanese Unexamined Patent Application Publication No. 2007-269010.

According to the developments in JP '010, a coated steel sheet having a coating film thickness of the coated steel sheet of 10 μm or less was obtained.

Meanwhile, in recent years, as flat-panel televisions have become popular, the demand for coated steel sheets having colored, especially black, films have increased regarding, for example, a panel for a flat-panel television.

Then, we attempted production of a black-coated steel sheet through addition of a black pigment on the basis of JP '010. As a result, it became clear that there was room for improvement in appearance of black-coated steel sheets when particularly severe press working was performed.

It could therefore be helpful to provide a black-coated steel sheet exhibiting a good appearance after press working, as well as a worked material thereof, especially a panel for a flat-panel television.

SUMMARY

We thus examined causes for degradation in appearance of the coating film having a reduced film thickness disclosed in JP '010 described above. As a result, we found that, regarding the appearance of the black-coated steel sheet after press working, in the case where press working was performed under the condition of a blank holder pressure during press working of about 49 kN (5 tf), no problems occur in appearance because of the effect of resin particles in JP '010, but under severe conditions in which the above-described blank holder pressure reached 98 kN (10 tf) or more, the appearance was dependent on the magnitude of the hardness of the bulk resin film in itself because the effect of the resin particles was reduced.

Therefore, we increased the hardness of the bulk resin film itself. As a result, we found that the hardness of the bulk resin film was improved and a black coating film excellent in appearance after press working, in which the blank holder pressure reached 98 kN or more, was able to be produced by adding especially an imino-containing melamine resin among melamine resins, which had been added previously as cross-linking agents having an effect on the solvent resistance, and carbon black at the same time to a polyester resin having predetermined characteristics.

We thus provide:

(1) A black-coated steel sheet characterized by including zinc based plating layers disposed on both surfaces of a steel sheet, a chromium-free chemical conversion coating disposed on the above-described zinc based plating layer on at least one surface of the above-described steel sheet, and a colored single organic coating which is disposed on the chemical conversion coating and which contains a polyester resin having a hydroxyl value of 10 KOHmg/g or more, an imino-containing melamine resin, and 5 to 15 percent by mass of carbon black, wherein the glass transition temperature (Tg) of the colored single organic coating is 40° C. or higher, the film thickness is 10 μm or less, and the hardness is 200 N/mm² or more.

(2) The black-coated steel sheet according to the above-described item (1), characterized in that in the case where the above-described colored single organic coating is provided on one surface of the steel sheet, the above-described chemical conversion coating or the organic resin layer is provided as the outermost surface of the other surface of the above-described steel sheet, and the conduction load of the other surface is 500 g or less.

(3) The black-coated steel sheet according to the above-described item (2), characterized in that the above-described organic resin layer contains a heat-absorbing pigment.

(4) A worked material formed by subjecting the black-coated steel sheet according to any one of the above-described items (1) to (3) to press working (5) A panel for a flat-panel television, characterized in that in the above-described item (4), the surface provided with the colored single organic coating of the above-described black-coated steel sheet is press-worked in such a way as to become a convex surface exposed at the outside.

Good bendability and excellent appearance after press working, in which the blank holder pressure is 98 kN or more, can be obtained regardless of addition of resin particles by including a cross-linking agent and the like of a colored single organic coating serving as a coating film on the above-described steel sheet.

In the case where the other surface of the thus obtained black-coated steel sheet is used as the inside surface of a press-worked panel, excellent electromagnetic shielding performance and heat dissipation performance are obtained, and the black-coated steel sheet is suitable for a worked material thereof, especially a panel for a flat-panel television.

DETAILED DESCRIPTION

As for the steel sheet provided with a zinc based plating layer serving as a base steel sheet of the coated steel sheet, various zinc based plated steel sheets, e.g., a hot-dip galvanized steel sheet, an electrogalvanized steel sheet, an alloyed hot-dip galvanized steel sheet, an alum-inum-zinc alloy plated steel sheet (for example, a hot-dip zinc-55 percent by mass aluminum alloy plated steel sheet and hot-dip zinc-5 percent by mass aluminum alloy plated steel sheet), an iron-zinc alloy plated steel sheet, and a nickel-zinc alloy plated steel sheet, can be used.

A chemical conversion coating disposed on the above-described zinc based plating layer does not contain chromium from the viewpoint of environmental protection. The above-described chemical conversion coating is disposed for the purpose of improving adhesion between the plating layer and the colored single organic coating mainly. Any material can be used with no trouble insofar as the material improves the adhesion. However, a material which can improve not only the adhesion, but also the corrosion resistance is more preferable. For example, a material containing silica fine particles from the viewpoint of adhesion and corrosion resistance and containing phosphoric acid and/or a phosphoric acid compound from the viewpoint of the corrosion resistance is favorable.

As for the silica fine particles, any one of wet silica and dry silica may be used. However, it is preferable that silica fine particles having a large effect of improving adhesion, especially dry silica, is contained.

As for the phosphoric acid and the phosphoric acid compound, at least one type selected from orthophosphoric acid, pyrophosphoric acid, polyphosphoric acid, and metal salts and compounds thereof may be contained. Furthermore, resins, e.g., an acrylic resin, and additives, e.g., a silane coupling agent, may be added appropriately.

The colored single organic coating disposed on the chemical conversion coating on at least one surface of the above-described steel sheet contains 5 to 15 percent by mass of carbon black in a total solid content of the coating and is specified to be an organic coating formed from a polyester resin having a hydroxyl value of 10 KOHmg/g or more and an imino-containing melamine resin, that is, an organic compound produced by cross-linking the above-described polyester resin with an imino-containing melamine resin.

The polyester resin constituting the above-described colored single organic coating may be produced by known methods and the condition to provide the above-described characteristics, e.g., the hydroxyl value, through the use of a polybasic acid component and a polyhydric alcohol and is a copolymer obtained by a heating reaction or the like.

As for the polybasic acid component, for example, phthalic anhydride, isophthalic acid, terephthalic acid, trimellitic anhydride, maleic acid, adipic acid, and fumaric acid can be used.

As for the polyhydric alcohol, for example, ethylene glycol, diethylene glycol, polyethylene glycol, propylene glycol, dipropylene glycol, polypropylene glycol, 1,4-butane diol, 1,6-hexane diol, neopentyl glycol, triethylene glycol, glycerin, pentaerithritol, trimethylene propane, and trimethylol ethane can be used.

Furthermore, regarding commercially available polyester resins, any one of "ALMATEX" (registered trade mark, produced by Mitsui Toatsu Chemicals, Inc.), "Alkynol" (trade name, produced by Sumitomo Bayer Urethane Co., Ltd.), "Desmophen" (registered trade mark, produced by Sumitomo Bayer Urethane Co., Ltd.), "VYLON" (registered trade mark, produced by Toyobo Co., Ltd.), and the like can be used favorably.

Moreover, the hydroxyl value of the above-described polyester resin is 10 KOHmg/g or more. If the hydroxyl value is less than 10 KOHmg/g, sites to effect a cross-linking reaction are reduced so that the solvent resistance is degraded and, in addition, the effect of addition of the imino-containing melamine resin is reduced.

It is favorable that the molecular weight of the above-described polyester resin is 2,000 or more, and less than 20,000 on a number average molecular weight basis. In the case where the molecular weight of the polyester resin is 2,000 or more, the coating does not become too hard, and a coating excellent in bendability results. In the case of less than 20,000, the cross-link density is sufficient so that the effect of addition of the imino-containing melamine resin is improved, and a coating excellent in appearance after press working results. A still more favorable number average molecular weight is 3,000 or more, and less than 10,000.

It is important that the colored single organic coating disposed on the chemical conversion coating is a coating in which the polyester resin is cross-linked sufficiently for the purpose of ensuring coating hardness, bendability, and appearance after press working and reducing dissolution and color changes due to the organic solvent.

To produce this sufficiently cross-linked coating, it is important that the imino-containing melamine resin is used as the cross-linking agent. In particular, a trifunctional imino-containing melamine resin can be used favorably.

The imino-containing melamine resin can be obtained by etherifying a methylol group of trimethylol melamine obtained through polycondensation of melamine and formaldehyde with a lower alcohol, e.g., methanol, ethanol, or butanol. Furthermore, as necessary, a condensation product of several molecules thereof may be used.

As for the above-described imino-containing melamine resin, in general, commercially available products, e.g., "CYMEL" (registered trade mark, produced by Mitsui Cyanamid) 325, 327, 701, 703, 254, and the like can also be used favorably.

The amount of addition of the above-described imino-containing melamine resin is preferably 5 to 50 parts by mass relative to 100 parts by mass of polyester resin. In the case where the amount of addition of the imino-containing melamine resin is 5 parts by mass or more relative to 100 parts by mass of polyester resin, the coating is hardened sufficiently, and an appearance after press working and the solvent resistance are improved. Moreover, in the case where the amount of addition of the imino-containing melamine resin is 50 parts by mass or less, the coating does not become too hard, no cracking occurs during bending, excellent bendability is exhibited, and the adhesion of the coating after working is improved.

It is also important that carbon black within the range of 5 to 15 percent by mass is contained in the colored single organic coating. In the case where the imino-containing melamine resin is used as the cross-linking agent, addition of the carbon black at the same time performs a function of complementing a cross-linking function. As a result, the cross-link becomes firmer, an increase in coating hardness is realized, and an excellent appearance is exhibited after press working in which the blank holder pressure reaches 98 kN or more. In addition, a downstream coating step can be omitted, an improvement of productivity is facilitated with advantage, and performance of concealment of the color of a basis material and a flaw of the basis material is facilitated with advantage.

If the amount of carbon black is less than 5 percent by mass, the above-described effects are not obtained. On the other hand, if 15 percent by mass is exceeded, the coating becomes brittle because of excessive pigment.

Also, the reason for an occurrence of a function of complementing the cross-link due to combination of the imino-containing melamine resin and the carbon black is not completely certain, but it is believed to be that a network structure of resin molecules in the inside of the coating becomes dense.

Meanwhile, an appropriate amount of the following additives can be blended into the colored single organic coating in accordance with the purpose and use. Examples of the additives include natural wax or synthetic wax, curing catalysts, e.g., p-toluenesulfonic acid, stannous octoate, dibutyltin laurate, and lead 2-ethylhexoate, an antifoaming agent, a pigment dispersing agent, and an antirunning agent. Furthermore, organic resin particles, particulate acrylic resin, nylon resin, and the like may be added depending on the press working condition, e.g., light press.

Moreover, an antirust pigment and an antirust agent can also be blended into the colored single organic coating in combination. As for the antirust pigment and the antirust agent, known antirust pigments and antirust agents, e.g., zinc phosphate, zinc phosphite, aluminum phosphate, aluminum phosphite, molybdates, phosphate-molybdates, vanadic acid/phosphoric acid mixed pigment, and silica and so-called "calcium silicate" which is Ca-adsorption type silica.

It is necessary that the glass transition temperature (Tg) of the above-described colored single organic coating is 40° C. or higher.

This is because if the glass transition temperature Tg is lower than 40° C., the toughness of the coating is reduced, sufficient press workability is not obtained and, in addition, characteristics, e.g., the coating hardness and coating adhesion after working are degraded.

The glass transition temperature is measured by using a rigid body pendulum type physical property measuring apparatus. The temperature at which the relationship between the logarithmic decrement in free damped vibration of a rigid body pendulum placed on a coated steel sheet and the temperature of the coated steel sheet shows a local maximum is defined as the glass transition temperature of a coating film adhered to the coated steel sheet. Therefore, the glass transition temperature Tg we use is different from Tg of a free film of coating.

It is further favorable that the glass transition temperature Tg is within the range of 60° C. or higher, and lower than 90° C. This is because in the case where Tg is lower than 90° C., the coating does not become too hard, and during working, no cracking occurs in the coating.

The film thickness of the above-described colored single organic coating is 10 μm or less. This is because if the film thickness exceeds 10 μm, not only a long time is necessary for forming the coating, but also the amount of coating falling off a cut end surface during press working increases and, thereby, an appearance may be impaired because of adhesion to a product. Less than 5 μm is more preferable.

Meanwhile, it is preferable that the above-described film thickness is specified to be 1 μm or more. This is because in the case where the film thickness is specified to be 1 μm or more, the film thickness concerned becomes uniform and there is no portion where the amount of color pigment is low, so that performance of concealment of the color of a basis material and a flaw of the basis material becomes sufficient and the corrosion resistance also becomes sufficient. More preferably, the film thickness is 3 μm or more.

The film thickness of the above-described colored single organic coating can be determined by calculating an average value of film thicknesses measured by using an optical microscope or an electron microscope at 15 points or more in total of at least 5 visual fields, each visual field including 3 arbitrary points, of a cross-section of the steel sheet provided with the coating.

In addition, the hardness of the above-described colored single organic coating is 200 N/mm$^2$ or more. This is because if the coating film hardness is less than 200 N/mm$^2$, an appearance after press working in which the blank holder pressure reaches 98 kN (10 tf) or more becomes poor.

The coating film hardness of the above-described colored single organic coating is measured with a Fischer hardness meter (produced by Fisher Instruments K.K.). Specifically, FISCHERSCOPE HM2000 is used, and Martens hardness is determined following the method stipulated in ISO EN DIN 14577.

In the case where the coated steel sheet is used as, for example, a panel for a flat-panel television, it is preferable that the back face of the coated steel sheet serving as the inside surface of a press-worked panel is provided with electrical conductivity because welding, electromagnetic shielding, or the like is necessary.

In such a case, the same level of corrosion resistance and adhesion as those of a conventional chromate coating can be ensured and, in addition, excellent electrical conductivity can be provided by disposing the above-described chromium-free chemical conversion coating or organic resin layer on the plating layer of the back face of the above-described coated steel sheet. Regarding electrical conductivity, it is preferable that the conduction load is 500 g or less from the viewpoint of electromagnetic shielding performance. It is further preferable that the conduction load is 300 g or less. In this regard, the conduction load refers to a minimum load required to provide a surface resistance of $10^{-4}\Omega$ or less.

In the use in which a demand for corrosion resistance is not so high, this other surface is provided with only a chromium-free chemical conversion coating and, thereby, a coated steel sheet especially excellent in electromagnetic shielding performance can be provided.

In uses in which a demand for corrosion resistance is high, it is preferable that an organic resin layer is disposed on the above-described chemical conversion coating, as neces-sary. In this case, as for the organic resin layer, an epoxy resin, an amine-modified epoxy resin, a polyester resin, or the like is favorable. Furthermore, to obtain additional excellent corrosion resistance, it is advantageous that this organic resin layer contains Ca ion-exchanged silica.

In this regard, the above-described organic resin layer can be disposed directly on the plating layer. In this case, as for the organic resin layer, an epoxy resin, an amine-modified epoxy resin, or a polyester resin is favorable.

In uses in which the demand for heat dissipation performance is high, it is advantageous that an organic resin layer containing a heat-absorbing pigment is disposed on the above-described chemical conversion coating.

Examples of such organic resin layers include an epoxy resin, an acrylic resin, an urethane resin, a phenol resin, an urea resin, and a polyester resin.

Furthermore, the heat-absorbing pigment is not specifically limited, and known pigments may be used. However, it is necessary to increase the integrated emissivity by addition. Consequently, examples thereof include carbon black, aniline black, polymethylene dyes, tris-azo dye amine salts, cyanine dyes or metal complexes thereof, iron oxide, silicon oxide, and magnesium silicates. These heat-absorbing pigments may be added alone, or at least two types may be combined.

In this regard, the integrated emissivity in the wavelength range of 4.5 to 25 μm is determined by integrating the surface spectral reflectance (R) indicated relative to the black body radiation, which is assumed to be 1 (100%) at the same temperature, with respect to the wavelength range.

The amount of addition of the heat-absorbing pigment to the organic resin layer is preferably 0.1 percent by mass or more, and 20 percent by mass or less. This is because a heat absorption effect is obtained sufficiently through addition of 0.1 percent by mass or more, and in the case where the addition is specified to be 20 percent by mass or less, the corrosion resistance of the coating is not degraded.

The coated steel sheet excellent in appearance is suitable for members used in applications to electronic apparatus, home appliances, and the like in which the electromagnetic shielding performance and heat dissipation performance after press working are required. For example, the coated steel sheet is suitable for applications to casings, back covers, backlight chassis, and structural members of plasma display panels and flat-panel televisions, e.g., liquid crystal televisions. Furthermore, in the case where the surface provided with the above-described colored single organic coating is press-worked in such a way as to become a convex surface exposed at the outside, the coated steel sheet excellent in appearance can be used for members used in applications to electronic apparatus, home appliances, and the like, in which the electromagnetic shielding performance and the heat dissipation performance are required, and a part required to have design flexibility of a surface exposed to the outside. For example, the coated steel sheet is suitable for applications to back panels of plasma display panels and liquid crystal televisions.

EXAMPLE 1

Next, examples will be described.

As for zinc based plated steel sheet for coating, an electro-galvanized steel sheet (symbol of plating type; EG), a hot-dip galvanized steel sheet (symbol of plating type; GI), an alloyed hot-dip galvanized steel sheet (Fe content: 10 percent by mass, symbol of plating type; GA), a hot-dip Zn—Al plated steel sheet (Al content: 4.5 percent by mass, symbol of plating type; GF), and a hot-dip Zn—Al plated steel sheet (Al content: 55 percent by mass, symbol of plating type; GL), each having a sheet thickness: 0.5 mm, were prepared.

The amount of deposit of plating per one surface (g/m$^2$) of each steel sheet is shown in Table 1. In this regard, the amounts of deposit of plating and the plating composition of one surface (front face) and the other surface (back face) of the steel sheet were specified to be the same. The above-described zinc based plated steel sheets were subjected to a degreasing treatment and, thereafter, treatments described in the following items (i) and (ii) were performed, so that plated steel sheets serving as samples were produced:

(i) A predetermined chemical conversion treatment agent was applied to the front face with a bar coater, drying was performed and, thereafter, a chemical conversion treatment agent, which is the same as or different from that of the front face, was applied to the back face, as necessary. Subsequently, a heat treatment was performed in such a way that the sheet temperature reached 100° C. after heating for 10 seconds and, thereby, chemical conversion coatings having the compositions and the film thicknesses shown in Table 1 were formed on the front face and the back face.

In this regard, the compositions of the chemical conversion coatings formed on the front face and the back face are shown in Table 3 separately.

(ii) Then, a colored single organic coating paint containing a polyester resin, an imino-containing melamine resin, and carbon black (regarding the content, refer to Table 1) was applied as the colored single organic coating to the front face in such a way that the dry film thickness shown in Table 1 was achieved. Thereafter, as necessary, an organic resin paint having a composition shown in Table 1 (Table 4 regarding the additive types of the organic resin layer on the back face) was applied to the back face. Subsequently, a heat treatment was performed in such a way that the sheet temperature reached 190° C. after 20 seconds from the starting of heating and, thereby, the colored single organic coating on the front face and/or the organic resin layer on the back face was formed.

The properties described below of each of the thus obtained black-coated steel sheets were examined.

The obtained results are shown in Table 2.

The coating hardness in the present test was measured with FISCHERSCOPE HM2000 described above. As is clear from the results shown in Table 1, it was ascertained that the coating hardness of every Example was 200 N/mm$^2$ or more.

Evaluation of Front Face

Bendability

The above-described bendability was on the basis of JIS Z2248-1996. A test piece was prepared by cutting the above-described coated steel sheet into the size of length: 60 mm and width: 30 mm. The above-described coated steel sheet was subjected to so-called "OT bending," which is 180° bending at room temperature, and the vertex area of the bended portion was observed visually. The evaluation was performed on the basis of the following criteria:

○: No cracking of organic coating is observed

×: Cracking of organic coating is observed.

Appearance After Press Working

Each of the above-described coated steel sheets was subjected to truncated cone forming in such a way that the front face became the punch side under the condition of blank diameter: 100 mm, punch diameter: 50 mm, punch shoulder: 4 mmR, die diameter: 70 mm, die shoulder: 4 mmR, and forming height: 18 mm while the blank holder pressure was specified to be two levels of 49 kN (5 tf) and 98 kN (10 tf). An appearance of the coating film of the side wall portion was observed visually, and evaluation was performed on the basis of the following criteria:

⊙: No change in appearance due to damage occurred
○: Changes in appearance due to slight damage were observed
×: Many damages occurred and changes in appearance were significant.

Basis Material Concealment Performance

Regarding the basis material concealment performance, the front face of the above-described plated steel sheet before formation of the chemical conversion coating was scratched with a pen having a metal end and, thereafter, each of the coated steel sheets was produced by performing the above-described treatment steps to form coating films. The front face was observed visually. The evaluation was performed on the basis of the following criteria:

○: Flaw is not obvious
×: Flaw is obvious.

Solvent Resistance

The front face of the organic coating of the above-described coated steel sheet was subjected to 10 times of ethanol rubbing tests with a load of 4.9 N (0.5 kgf), the range of changes in L value (luminosity) between before and after the ethanol rubbing test (ΔL) was measured, and evaluation was performed on the basis of the following criteria:

⊙: ΔL is 1 or less
○: ΔL is within the range of more than 1, and 2 or less
×: ΔL is more than 2.

Corrosion Resistance

A test piece (size: 100 mm×50 mm) was cut from the above-described each sample, the end portions and the back face of the test piece were tape-sealed. Thereafter, on the basis of JIS Z 2371-2000, a step of spraying 5 percent by mass of salt water at 35° C. for 8 hours, followed by a suspension for 16 hours, which was assumed to be one cycle, was performed three cycles. Subsequently, changes in appearance of the coating surface was evaluated. The evaluation was performed on the basis of the following criteria:

⊙: There is no change of surface
○: Rust develops slightly on the surface
×: Much rust develops on the surface.

Evaluation of Back Face (6) Electrical Conductivity

A low resistivity meter (Loresta GP, registered trade mark; produced by MITSU-BISHI CHEMICAL CORPORATION: ESP Probe) was used, and the surface resistance value of the back face of each sample was measured. At that time, the load applied to the end of the probe was increased at 20 g/s, and evaluation was performed as described below on the basis of the load value when the surface resistance value reached $10^{-4} \Omega$ or less:

⊙: Average load based on measurements of 10 points is 300 g or less
○: Average load based on measurements of 10 points is more than 300 g, and 500 g or less
Δ: Average load based on measurements of 10 points is more than 500 g, and 700 g or less
×: Average load based on measurements of 10 points is more than 700 g.

(7) Wet Corrosion Resistance

The back face was brought into contact with black felt containing 200 g/cm² of pure water, 29.42 kPa (300 gf/cm²) of load was applied, and changes in appearance after standing for 48 hours in an environment of temperature: 20° C. and relative humidity: 60% was evaluated. The evaluation was performed on the basis of the following criteria:

⊙: There is no change of surface
○: Rust develops slightly on the surface
×: Much rust develops on the surface.

(8) Heat Dissipation Performance

The spectral emissivity of each sample at 100° C. was measured in the range of wavelength: 4.5 to 25 μm and was indicated relative to the black body radiation, which was assumed to be 1 (100%) at the same temperature. The spectral emissivity value was integrated with respect to the above-described range of wavelength to calculate the integrated emissivity, and the evaluation was performed on the basis of the following criteria:

⊙: 0.7 or more
○: 0.4 or more, and less than 0.7
×: less than 0.4.

TABLE 1

| | One surface of steel sheet (front face) | | | | | | | | |
|---|---|---|---|---|---|---|---|---|---|
| | Plating layer | | Chemical conversion coating | | Colored single organic coating | | | | |
| | | | | | Polyester resin | | Cross-linking agent Type | Ratio of resin/cross-linking agent | Carbon black content (percent by mass) | Other material content (percent by mass) |
| | Type | Amount of deposit g/m² | Composition *1 (Table 3) | Film thickness (μm) | Molecular weight | Hydroxyl value | | | | |
| Example 1 | EG | 20 | 1 | 0.2 | 4000 | 15 | Cymel 327 | 75/25 | 10 | 15*2 |
| Example 2 | GA | 40 | 1 | 0.2 | 10000 | 12 | Cymel 327 | 90/10 | 10 | 10*2 |
| Example 3 | GI | 60 | 1 | 0.2 | 10000 | 12 | Cymel 701 | 60/40 | 10 | 18*2 |
| Example 4 | GF | 60 | 1 | 0.2 | 4000 | 18 | Cymel 701 | 70/30 | 10 | 10*2 |
| Example 5 | GL | 60 | 1 | 0.2 | 15000 | 10 | Cymel 701 | 50/50 | 15 | 10*2 |
| Example 6 | EG | 20 | 1 | 0.2 | 4000 | 15 | Cymel 327 | 75/25 | 5 | 10*2 |
| Example 7 | EG | 20 | 1 | 0.2 | 4000 | 15 | Cymel 327 | 75/25 | 12 | 10*2 |

TABLE 1-continued

| | | | | | | | | | | |
|---|---|---|---|---|---|---|---|---|---|---|
| Example 8 | EG | 20 | 1 | 0.2 | 4000 | 15 | Cymel 327 | 75/25 | 12 | 10*2 |
| Example 9 | GA | 40 | 1 | 0.2 | 10000 | 12 | Cymel 327 | 90/10 | 10 | 10*2 |
| Example 10 | EG | 20 | 1 | 0.2 | 4000 | 15 | Cymel 327 | 75/25 | 12 | 10*2 |
| Comparative Example 1 | EG | 20 | 1 | 0.2 | 20000 | 5 | Cymel 327 | 75/25 | 10 | 10*2 |
| Comparative Example 2 | EG | 20 | 1 | 0.2 | 15000 | 10 | Cymel 327 | 90/10 | 10 | 10*2 |
| Comparative Example 3 | EG | 20 | 1 | 0.2 | 4000 | 15 | Cymel 303 | 75/25 | 10 | 10*2 |
| Comparative Example 4 | EG | 20 | 1 | 0.2 | 4000 | 15 | HDI | 75/25 | 10 | 10*2 |
| Comparative Example 5 | EG | 20 | 1 | 0.2 | 4000 | 15 | Cymel 327 | 75/25 | 3 | 10*2 |
| Comparative Example 6 | EG | 20 | 1 | 0.2 | 4000 | 15 | Cymel 327 | 75/25 | 20 | 10*2 |
| Comparative Example 7 | EG | 20 | 1 | 0.2 | 20000 | 5 | Cymel 327 | 75/25 | 5 | 10*3 |

| | One surface of steel sheet (front face) Colored single organic coating | | | Other surface (back face) | | | | |
|---|---|---|---|---|---|---|---|---|
| | | | | Chemical conversion coating | | Organic resin layer | | |
| | Tg (°C.) | Film thickness (μm) | Hardness (N/mm²) | Composition *1 (Table 3) | Film thickness (μm) | Resin type | Additive Type*1 (Table 4) | Film thickness (μm) |
| Example 1 | 70 | 4.5 | 246 | 1 | 0.2 | epoxy | 1 | 0.4 |
| Example 2 | 50 | 3.0 | 205 | 2 | 0.3 | epoxy | — | 0.3 |
| Example 3 | 60 | 3.0 | 232 | 2 | 0.2 | amine-modified epoxy | 1 | 0.4 |
| Example 4 | 80 | 4.5 | 218 | 2 | 0.2 | amine-modified epoxy | — | 0.4 |
| Example 5 | 40 | 4.5 | 275 | 1 | 0.3 | polyester | — | 0.3 |
| Example 6 | 70 | 4.5 | 210 | 1 | 0.3 | polyester | — | 0.3 |
| Example 7 | 70 | 3.0 | 237 | 1 | 0.2 | polyester | 3 | 0.7 |
| Example 8 | 70 | 3.0 | 237 | — | 0 | amine-modified epoxy | 2 | 0.7 |
| Example 9 | 50 | 3.0 | 205 | 1 | 0.2 | polyester | 3 | 1.0 |
| Example 10 | 70 | 1.0 | 237 | 1 | 0.2 | polyester | — | 0.3 |
| Comparative Example 1 | 50 | 3.0 | 177 | 2 | 0.7 | amine-modified epoxy | 1 | 0.1 |
| Comparative Example 2 | 20 | 5.0 | 75 | 1 | 0.3 | epoxy | 1 | 1.0 |
| Comparative Example 3 | 70 | 5.0 | 105 | 1 | 0.3 | polyester | 3 | 0.3 |
| Comparative Example 4 | 70 | 3.0 | 92 | 2 | 0.2 | amine-modified epoxy | 1 | 0.4 |
| Comparative Example 5 | 70 | 5.0 | 202 | 1 | 0.3 | — | — | 0 |
| Comparative Example | 70 | 3.0 | 253 | 1 | 0.3 | polyester | — | 0.3 |

TABLE 1-continued

|  |  |  |  |  |  |  |  |  |
|---|---|---|---|---|---|---|---|---|
| Example 6 Comparative Example 7 | 50 | 7.0 | 156 | 1 | 0.2 | epoxy | 1 | 0.4 |

Cymel 327: imino-containing melamine
Cymel 701: methylol group, imino-containing melamine
Cymel 303: completely alkyl type melamine resin (not including imino group)
HDI: hexamethylene diisocyanate (not imine-containing product)
*1: shown in Tables 3 and 4, respectively, provided as separate Tables
*2: containing 5 percent by mass of nylon resin particles and the remainder of polytetrafluoroethylene wax
*3: containing nylon resin particles

TABLE 2

| | Performance evaluation | | | | | | | |
|---|---|---|---|---|---|---|---|---|
| | Front face | | | | | Back face | | |
| | Bendability | Appearance after press working (48 kN/98 kN) | Basis material concealment performance | Solvent resistance | Corrosion resistance | Electrical conductivity | Wet corrosion resistance | Heat dissipation performance |
| Example 1 | ○ | ⊙/⊙ | ○ | ⊙ | ⊙ | ⊙ | ⊙ | X |
| Example 2 | ○ | ⊙/⊙ | ○ | ○ | ○ | ⊙ | ○ | ○ |
| Example 3 | ○ | ⊙/⊙ | ○ | ⊙ | ⊙ | ⊙ | ○ | X |
| Example 4 | ○ | ⊙/○ | ○ | ⊙ | ⊙ | ⊙ | ○ | X |
| Example 5 | ○ | ⊙/○ | ○ | ○ | ○ | ⊙ | ⊙ | X |
| Example 6 | ○ | ⊙/○ | ○ | ⊙ | ⊙ | ⊙ | ⊙ | X |
| Example 7 | ○ | ⊙/⊙ | ○ | ⊙ | ⊙ | ⊙ | ⊙ | ○ |
| Example 8 | ○ | ⊙/⊙ | ○ | ⊙ | ⊙ | ⊙ | ⊙ | X |
| Example 9 | ○ | ⊙/⊙ | ○ | ○ | ○ | ⊙ | ⊙ | ⊙ |
| Example 10 | ○ | ⊙/○ | ○ | ○ | ○ | ⊙ | ⊙ | X |
| Comparative Example 1 | ○ | ⊙/X | ○ | X | X | ○ | X | X |
| Comparative Example 2 | ○ | ⊙/X | ○ | ○ | ○ | ○ | ○ | X |
| Comparative Example 3 | X | ⊙/X | ○ | X | ○ | ⊙ | ○ | X |
| Comparative Example 4 | X | ⊙/X | ○ | X | ○ | ⊙ | ○ | X |
| Comparative Example 5 | ○ | ○/○ | X | ⊙ | ○ | ⊙ | X | X |
| Comparative Example 6 | X | X/X | ○ | ⊙ | X | ⊙ | ⊙ | X |
| Comparative Example 7 | X | ⊙/X | ○ | ○ | ⊙ | ⊙ | ⊙ | X |

TABLE 3

| | |
|---|---|
| 1 | dry silica*: 50 percent by mass, Zr compound**: 50 percent by mass |
| 2 | wet silica***: 50 percent by mass, phosphoric acid: 20 percent by mass, Zr compound**: 30 percent by mass |

*dry silica; AEROSIL #200 produced by Nippon Aerosil Co., Ltd.
**Zr compound; ammonium zirconium carbonate produced by Daiichi Kigenso Kagaku Kogyo Co., Ltd.
***wet silica; SNOWTEX O produced by NISSAN CHEMICAL INDUSTRIES, LTD.

TABLE 4

| | |
|---|---|
| 1 | Ca-exchanged silica****: 20 percent by mass |
| 2 | Al phosphate: 2 percent by mass, Mg phosphate: 2 percent by mass, Mn phosphate: 2 percent by mass |
| 3 | carbon black: 10 percent by mass |

****Ca-exchanged silica; Shieldex C303 produced by Grace Davison

As is clear from Table 2, our black-coated steel sheets provided with the colored single organic coating have excellent effects on bendability, appearance after press working, basis material concealment performance, solvent resistance, and corrosion resistance (front face) regardless of addition of resin particles.

Furthermore, the other surface (back face) had fully satisfactory electrical conduc-tivity and wet corrosion resistance. In particular, in Examples 2, 7, and 9 concerned, good heat dissipation performance was obtained in combination. These results indicate effects of high emissivity of back face plating layers in Examples 2 and 9 and containment of the heat-absorbing pigment in the back face organic resin layer in Examples 7 and 9. Moreover, in Example 9, a synergetic effect of the plating layer and the heat-absorbing pigment is shown. On the other hand, the Comparative Examples were insufficient in each point of the appearance after press working, in particular the appearance when the blank holder pressure was 98 kN (10 tf), bend-ability, basis material concealment performance, solvent resistance, and corrosion resistance.

INDUSTRIAL APPLICABILITY

The black-coated steel sheet which includes the thin colored single organic coating having a film thickness of 10 μm or less and which is excellent in bendability and appearance after press working can be obtained stably. Such a black-coated steel sheet is especially suitable for application to a panel for a flat-panel television.

The invention claimed is:

1. A black-coated steel sheet comprising:
   zinc based plating layers disposed on both surfaces of a steel sheet;
   a chromium-free chemical conversion coating disposed on the zinc based plating layer on at least one surface of the steel sheet; and
   a colored single organic coating which is disposed on at least one of the chemical conversion coating and which comprises a polyester resin having a hydroxyl value of 10 KOHmg/g or more, an imino-containing melamine resin, and 5 to 15 percent by mass of carbon black,
   wherein the glass transition temperature (Tg) of the colored single organic coating is 40° C. or higher, the film thickness is 10 μm or less, and the hardness is 200 N/mm$^2$ or more.

2. A worked material formed by subjecting the black-coated steel sheet according to claim 1 to press working.

3. A panel for a flat-panel television comprising the worked material of claim 2, wherein a surface provided with the colored single organic coating of the black-coated steel sheet is press-worked into a convex surface exposed at an outer portion of the panel.

4. The black-coated steel sheet according to claim 1, wherein, when the colored single organic coating is provided on one surface of the steel sheet, the chemical conversion coating or an organic resin layer is provided as an outermost surface of another surface of the steel sheet, and conduction load of another surface is 500 g or less.

5. A worked material formed by subjecting the black-coated steel sheet according to claim 4 to press working.

6. A panel for a flat-panel television comprising the worked material of claim 5, wherein a surface provided with the colored single organic coating of the black-coated steel sheet is press-worked into a convex surface exposed at an outer portion of the panel.

7. The black-coated steel sheet according to claim 4, wherein the organic resin layer comprises a heat-absorbing pigment.

8. A worked material formed by subjecting the black-coated steel sheet according to claim 7 to press working.

9. A panel for a flat-panel television comprising the worked material of claim 8, wherein a surface provided with the colored single organic coating of the black-coated steel sheet is press-worked into a convex surface exposed at an outer portion of the panel.

* * * * *